INTEGRATED TWO TRANSISTOR SEMICONDUCTOR DEVICE
Filed Oct. 6, 1964 2 Sheets-Sheet 1
Fig. 1.
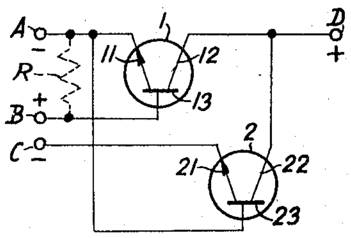
Fig. 2.
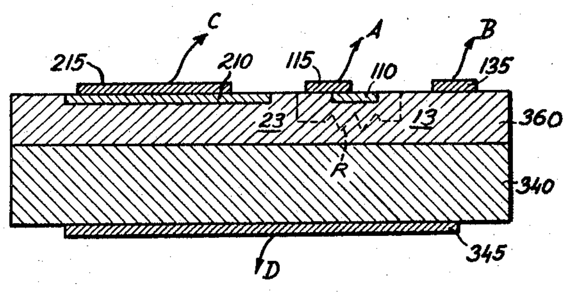
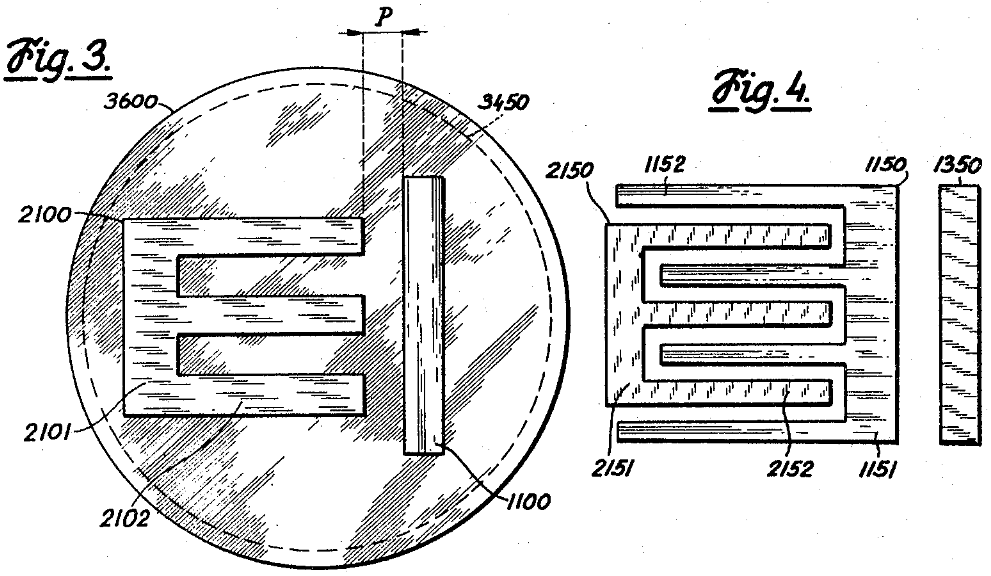
Fig. 3. Fig. 4.
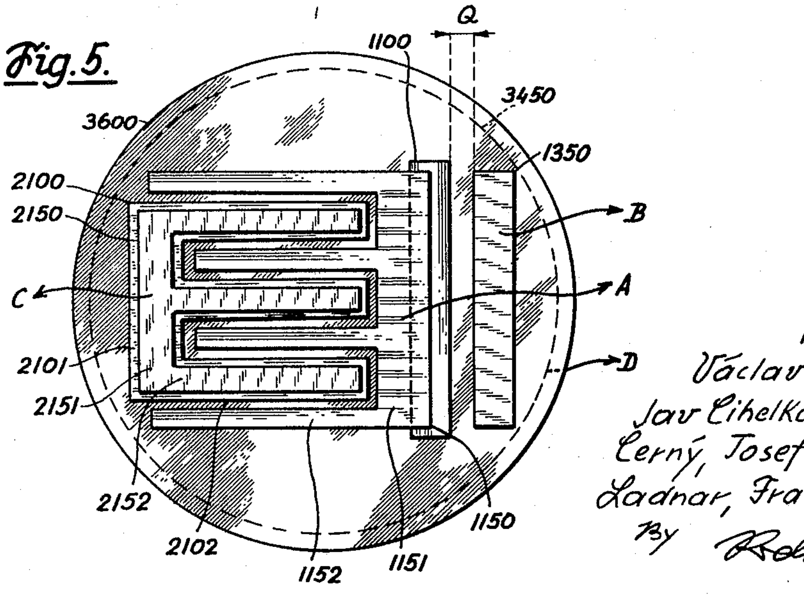
Inventors
Václav Husa, Jaroslav Cihelka, Ladislav Černý, Josef Kříž, Josef Ladnar, František Luxa
By Richard Low
Ag't

INTEGRATED TWO TRANSISTOR SEMICONDUCTOR DEVICE

Filed Oct. 6, 1964 2 Sheets-Sheet 2

Inventors
Václav Husa, Jaroslav Cihelka, Ladislav Černý, Josef Kříž, Josef Ladnar František Luxa BY
Richard Low
Ag't United States Patent Office 3,316,466
Patented Apr. 25, 1967

3,316,466

INTEGRATED TWO TRANSISTOR SEMICONDUCTOR DEVICE

Václav Husa, Pecky, Jaroslav Cihelka, Prague, Ladislav Černy, Sadska, Josef Kříž and Josef Ladnar, Prague, and František Luxa, Horni Pocernice, Czechoslovakia, assignors to Statni vyzkumny ustav silnoproude elektrotechniky, Bechovice, Czechoslovakia
Filed Oct. 6, 1964, Ser. No. 401,931
Claims priority, application Czechoslovakia, Oct. 7, 1963, 5,496/63
9 Claims. (Cl. 317—235)

The present invention relates to an integrated two transistor semiconductor device.

An object of this invention is to provide improvements in and relating to semiconductor elements comprising two transistors with directly connected collectors and with the emitter electrode of the first transistor connected with the base electrode of the second transistor. This semiconductor element has four terminals. One terminal leads from both connected collectors, the second terminal from the emitter of the first transistor connected with the base of the second transistor, the third terminal leads from the base of the first transistor and the fourth terminal leads from the emitter of the second transistor. The thus arranged semi-conductor element is supported by a semiconductor base plate representing both above mentioned and mutually connected collectors.

Known semiconductor elements of this type do not achieve the required maximum values, because the arrangement both of the respective emitters and their contacts as surface layers do not comply with the requirements of the optimum conditions for the function and output of similar semiconductor elements. The known semiconductor elements of this type also have rather unfavorable temperature curves.

The semiconductor device of the present invention overcomes the disadvantages of similar devices of the prior art.

In order that the present invention may be readily carried into effect, it will now be described with reference to the accompanying drawnings, wherein:

FIG. 1 is a circuit diagram of the semiconductor device of the present invention;

FIG. 2 is a diametrical sectional view of a basic semiconductor device of the type of the present invention;

FIG. 3 is a top view of the emitter layers of an embodiment of the semiconductor device of the present invention;

FIG. 4 is a top view of the contact layers of the semiconductor device of the present invention;

FIG. 5 is a top view of the embodiment of FIGS. 3 and 4 of the present invention.

Figure 6:
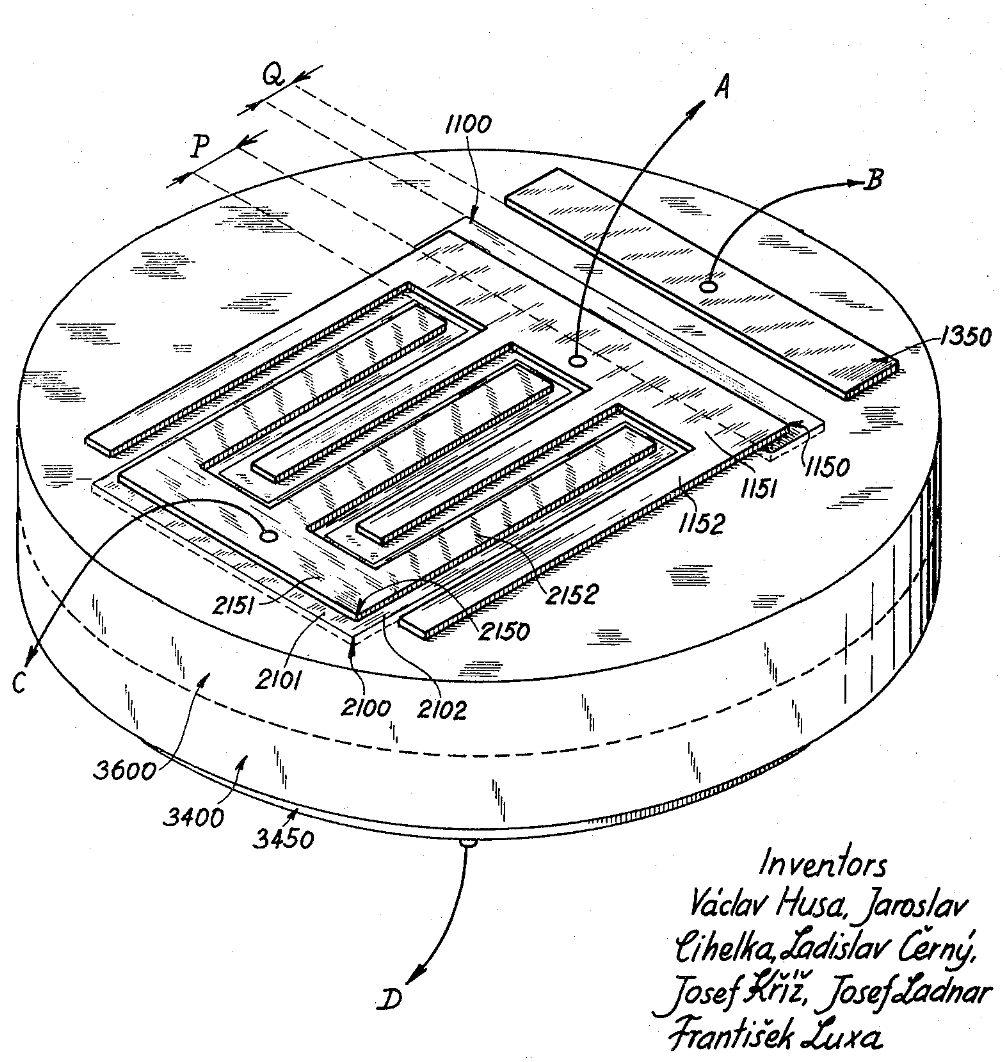
FIG. 6 is a perspective view of the embodiment of FIGS. 3, 4 and 5 of the present invention.

The wiring diagram in FIG. 1 includes two transistors, the first transistor 1 comprising an emitter 11, collector 12 and base 13, whereas the second transistor 2 has an emitter 21, a collector 22 and a base 23. These transistor electrodes are hereinafter referred to as first emitter 11, first collector 12, first base 13 and second emitter 21, second collector 22 and second base 23. The integrated semi-conductor element has four terminals. The first emitter 11 and the second base 23 are connected to the first terminal A. The second terminal B is connected to the first base 13. The third terminal C is connected to the second emitter 21. Both collectors 12 and 22 are connected to the fourth terminal D. Control pulses or signals are supplied to the terminals A and B, whereas the terminals C and D are included in the controlled circuit.

The device shown in FIG. 2 comprises a face plate 340 of one conductivity type provided with a first layer 360 of the opposite conductivity type. The lower surface of the base plate 340, which represents the common collector of both transistors 1 and 2 is provided with the respective contact layer 345, which is connected to the fourth terminal D. The first layer 360 represents both bases 13 and 23 whereby it is supposed that the areas of both bases 13 and 23 are mutually galvanically separated by the ohmic resistance of the first layer 360.

The layers 110 and 210, representing the first emitter 11 and the second emitter 21, are applied by diffusion upon the upper surface of the first layer 360. Thereafter the remaining contact layers are applied equally by diffusion. The contact layer 115 which simultaneously covers both the area of the second base 23 and the layer 110 represents the first emitter 11; the contact surface 215 upon the surface 210 represents the second emitter 21; and the contact surface 135 covers the area above the first base 13.

The object of this invention is not only the application of special shapes of the surfaces representing both emitters 11 and 21, but equally the use of special shapes of contact layers and the optimum mutual arrangement of all these layers upon the first layer, which forms the bases 13 and 23 of both transistors 1 and 2.

The wiring diagram of FIG. 1 has one and two digit numbers. Three digit numbers are utilized in FIG. 2 showing the semiconductor element in principle. In each of FIGS. 3, 4 and 5 four digit reference numbers are utilized.

In accordance with the present invention, the said layers are arranged on the first layer 3600 as shown in FIGS. 3, 4 and 5. The layer 1100 representing the first emitter 11 has the shape of a strip 1100 whereas the layer 2100 representing the second emitter 21 has the shape of a comb or E shape.

The comb 2100 comprises a connecting bridge 2101 and a number of extensions 2102 and is situated with respect to the strip 1100 so that the extremities of the extensions are at the distance P from the strip 1100. The contact layer 1350 of the first base 13 has the shape of a strip or band 1350 at the distance Q from the parallel with the strip 1100. The contact layer 1150, which simultaneously covers the area of the second base 23 and the layer 1100 representing the first emitter 11, has the shape of a contact comb 1150 or triple U-shape. The connecting bridge 1151 of the layer 1150 partially covers the strip 1100 and extends by means of its extensions 1152 into the gaps between the extensions 2102 of the comb 2100. The contact layer 2150 of the second emitter 21 has the shape of a contact comb 2150 or E-shape. The connecting bridge 2151 of the contact layer 2150 and extensions 2152 are arranged on the corresponding layer of the comb 2100 representing the second emitter 21.

The terminals A, B, C, D are shown in FIGS. 1, 2, 5 and 6. The terminal A is connected (FIGS. 5 and 6) to the connecting bridge 1151 of the comb 1150, the terminal B is connected to the band 1350, the terminal C is connected to the connecting bridge 2151 of the contact comb 2150 and the terminal D is connected to the contact layer 3450 arranged on the lower surface of the base plate 3400.

Due to the described arrangement of all layers, the shortest switching times of the semiconductor element and the maximum effect of this element are achieved. Due to the use of comb-shaped contact layers in the device of the present invention, the optimum length of the transition edges is achieved and thus the reduction of the specific current load. The consequence theerof, a favorable temperature curve is provided.

We claim:

1. An integrated semiconductor device comprising a first transistor having a first emitter, a first collector and a first base and a second transistor having a second emitter, a second collector and a second base, said semiconductor device comprising a semiconductor body having a base portion of determined conductivity type and a first layer of opposite conductivity type on said base portion;

a first emitter layer of strip configuration and of the same conductivity type as the base portion of said semiconductor body on the first layer of said semiconductor body comprising said first emitter, said first emitter layer forming a pn junction with said first layer of said semiconductor body;

a second emitter layer of comb configuration and of the same conductivity type as the base portion of said semiconductor body on the first layer of said semiconductor body spaced from said first emitter layer, said second emitter layer having a connecting bridge and a plurality of mutually spaced extensions each extending from said connecting bridge to a determined distance from said first emitter layer, said second emitter layer forming a pn junction with said first layer of said semiconductor body;

a first base contact layer of strip configuration on and in ohmic contact with the first layer of said semiconductor body spaced a determined distance from and parallel with said first emitter layer;

a contact layer of comb configuration on the first layer of said semiconductor body, said contact layer having a connecting bridge parallel with and partially covering and in ohmic contact with said first emitter layer and a plurality of mutually spaced extensions extending from said connecting bridge into the spaces between the extensions of said emitter layer;

a second emitter contact layer of comb configuration similar to that of said second emitter layer superimposed upon and in ohmic contact with said second emitter layer;

a first terminal electrically connected to said contact layer;

a second terminal electrically connected to said first base contact layer;

a third terminal electrically connected to said second emitter contact layer; and a fourth terminal electrically connected to the base portion of said semiconductor body.

2. An integrated semiconductor device as claimed in claim 1, wherein the base portion of said semiconductor body comprises said first and second collectors.

3. An integrated semiconductor device as claimed in claim 1, wherein the first layer of said semiconductor body comprises said first and second bases.

4. An integrated semiconductor device as claimed in claim 1, wherein said second emitter layer and said emitter contact layer are each of E-shape.

5. An integrated semiconductor device as claimed in claim 1, wherein said contact layer is of triple U-shaped.

6. An integrated semiconductor device as claimed in claim 1, wherein said second emitter layer has a connecting bridge and a plurality of mutually equally spaced parallel extensions each extending perpendicularly from said connecting bridge to a determined equal distance from said connecting bridge and to a determined equal distance from said first emitter layer.

7. An integrated semiconductor device as claimed in claim 6, wherein said contact layer has a connecting bridge parallel with and partially covering said first emitter layer and a plurality of mutually equally spaced parallel extensions each extending perpendicularly from said connecting bridge, said plurality of extensions including inner extensions each extending to a first determined equal distance from said connecting bridge and outer extensions each extending to a second determined equal distance from said connecting bridge different from said first determined distance.

8. An integrated semiconductor device as claimed in claim 7, wherein said second emitter contact layer is of comb configuration similar to that of said second emitter layer but of smaller dimensions than said second emitter layer.

9. An integrated semiconductor device as claimed in claim 8, wherein said first terminal is connected to the connecting bridge of said contact layer and said third terminal is connected to the connecting bridge of said second emitter contact layer.

References Cited by the Examiner

UNITED STATES PATENTS

| | | | |
|---|---|---|---|
| 2,985,804 | 5/1961 | Buie | 317—235 |
| 2,994,834 | 8/1961 | Jones | 330—39 |
| 3,241,013 | 3/1966 | Evans | 317—235 |

JOHN W. HUCKERT, *Primary Examiner.*

R. F. POLISSACK, *Assistant Examiner.*